United States Patent
Broyde et al.

(10) Patent No.: US 9,654,162 B2
(45) Date of Patent: May 16, 2017

(54) RADIO COMMUNICATION USING MULTIPLE ANTENNAS AND LOCALIZATION VARIABLES

(71) Applicant: Samsung Electronics Co., Ltd., Suwon-si, Gyeonggi-do (KR)

(72) Inventors: Frédéric Broyde, Maule (FR); Evelyne Clavelier, Maule (FR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/884,234

(22) Filed: Oct. 15, 2015

(65) Prior Publication Data
US 2016/0036474 A1    Feb. 4, 2016

Related U.S. Application Data

(63) Continuation of application No. PCT/IB2015/051548, filed on Mar. 3, 2015.

(30) Foreign Application Priority Data

Mar. 13, 2014    (FR) ..................... 14 00606

(51) Int. Cl.
*H04B 1/18* (2006.01)
*H01Q 1/24* (2006.01)
(Continued)

(52) U.S. Cl.
CPC .............. *H04B 1/18* (2013.01); *H01Q 1/242* (2013.01); *H01Q 21/0006* (2013.01);
(Continued)

(58) Field of Classification Search
CPC ....... H04B 1/18; H04B 7/0413; H03J 1/0008; H03J 7/04; H01Q 21/0006; H01F 27/008
(Continued)

(56) References Cited

U.S. PATENT DOCUMENTS 2,745,067 A    5/1956    True et al.
4,493,112 A    1/1985    Bruene
(Continued)

FOREIGN PATENT DOCUMENTS

FR    2996067 A1    3/2014
FR    2996082 A1    3/2014
(Continued)

OTHER PUBLICATIONS

Chan Wai Po et al, "A Novel Method for Synthesizing an Automatic Matching Network and Its Control Unit", IEEE Transactions on Circuits and Systems—I: Regular Papers, vol. 58, No. 9, pp. 2225-2236, Sep. 2011.

(Continued)

*Primary Examiner* — Hai V Nguyen
(74) *Attorney, Agent, or Firm* — Jefferson IP Law, LLP

(57) ABSTRACT

The invention relates to a method for radio communication using multiple antennas and localization variables, and to an apparatus for radio communication using multiple antennas and localization variables. An apparatus for radio communication of the invention comprises: 4 antennas, the 4 antennas forming an antenna array; a radio device; a sensor unit estimating a plurality of localization variables; an antenna tuning apparatus having 4 antenna ports, each of the antenna ports being coupled to one of the antennas through a feeder, the antenna tuning apparatus having 4 radio ports, each of the radio ports being coupled to the radio device through an interconnection; and a tuning control unit, the tuning control unit receiving a tuning instruction generated automatically within the apparatus for radio communication, the tuning control unit delivering a plurality of tuning control signals to the antenna tuning apparatus.

18 Claims, 7 Drawing Sheets

(51) Int. Cl.
*H04B 1/04* (2006.01)
*H04B 7/0413* (2017.01)
*H01Q 21/00* (2006.01)
*H03J 1/00* (2006.01)
*H03J 7/04* (2006.01)
*H01Q 21/28* (2006.01)

(52) U.S. Cl.
CPC .............. *H03J 1/0008* (2013.01); *H03J 7/04* (2013.01); *H04B 1/0458* (2013.01); *H04B 7/0413* (2013.01); *H01Q 21/28* (2013.01)

(58) Field of Classification Search
USPC ................................................. 455/77; 334/5
See application file for complete search history.

(56) References Cited

U.S. PATENT DOCUMENTS

| | | | | |
|---|---|---|---|---|
| 7,409,245 B1* | 8/2008 | Larson | .................... | H01Q 1/273 343/860 |
| 7,898,493 B1* | 3/2011 | Rojas | ........................ | H01Q 5/00 343/850 |
| 7,983,645 B2* | 7/2011 | Broyde | .................... | H04B 7/08 455/273 |
| 8,000,379 B2* | 8/2011 | Kishigami | ........... | H04B 1/0458 343/745 |
| 8,059,058 B2* | 11/2011 | Lau | ........................ | H01Q 1/521 343/853 |
| 8,111,150 B2* | 2/2012 | Miller | .................. | A61B 5/0031 334/5 |
| 8,174,460 B2* | 5/2012 | Larson | .................... | H01Q 1/273 343/860 |
| 8,204,446 B2* | 6/2012 | Scheer | .................... | H01Q 1/242 455/129 |
| 8,406,806 B2* | 3/2013 | Wong | ..................... | H01Q 1/243 455/550.1 |
| 8,571,511 B2* | 10/2013 | Goldfarb | .............. | H03D 7/1441 455/290 |
| 8,706,053 B2* | 4/2014 | Camp, Jr. | ................. | H04B 1/18 455/77 |
| 9,054,756 B2* | 6/2015 | See | ........................ | H04B 1/0458 |
| 9,077,317 B2* | 7/2015 | Broyde | .................... | H04B 1/0458 |
| 9,083,074 B2* | 7/2015 | Ayatollahi | ............. | H01Q 1/243 |
| 9,154,608 B2* | 10/2015 | Toksvig | .................. | H01Q 1/243 |
| 9,203,138 B2* | 12/2015 | Bavisi | ..................... | H01Q 1/243 |
| 9,294,174 B2* | 3/2016 | Broyde | ..................... | H01Q 3/40 |
| 9,337,534 B2* | 5/2016 | Broyde | ................. | H04B 7/0874 |
| 9,374,113 B2* | 6/2016 | Greene | ..................... | H04B 1/18 |
| 9,496,901 B2* | 11/2016 | Wehrmann | ........... | H04B 1/0458 |
| 9,520,904 B2* | 12/2016 | Horne | ...................... | H03H 7/40 |
| 2003/0030594 A1* | 2/2003 | Larry | ...................... | H01Q 11/08 343/895 |
| 2007/0071149 A1* | 3/2007 | Li | ......................... | H04B 7/0805 375/347 |
| 2007/0184802 A1* | 8/2007 | Carvalho | ............. | H04B 7/0811 455/277.1 |
| 2008/0180345 A1* | 7/2008 | Larson | .................... | H01Q 1/273 343/861 |
| 2008/0288028 A1* | 11/2008 | Larson | .................... | H01Q 1/273 607/60 |
| 2009/0146891 A1* | 6/2009 | Chen | ........................ | H03H 7/40 343/745 |
| 2009/0147834 A1* | 6/2009 | Kishigami | ........... | H04B 1/0458 375/148 |
| 2010/0215111 A1* | 8/2010 | Filipovic | .............. | H04B 7/0608 375/267 |
| 2010/0248673 A1* | 9/2010 | Broyde | .................... | H04B 7/08 455/278.1 |
| 2011/0076966 A1 | 3/2011 | Ishimiya | | |
| 2011/0159828 A1* | 6/2011 | Kasha | ........................ | H04B 1/18 455/150.1 |
| 2012/0071203 A1* | 3/2012 | Wong | ..................... | H01Q 1/243 455/550.1 |
| 2012/0202445 A1* | 8/2012 | Manetakis | ............... | H04B 1/18 455/341 |
| 2012/0314811 A1* | 12/2012 | Goldfarb | .............. | H03D 7/1441 375/316 |
| 2012/0329524 A1 | 12/2012 | Kent et al. | | |
| 2013/0069737 A1* | 3/2013 | See | ........................... | H04B 1/18 333/32 |
| 2013/0156080 A1* | 6/2013 | Cheng | .................... | H01Q 1/243 375/222 |
| 2013/0267181 A1* | 10/2013 | Ayatollahi | ............. | H01Q 1/243 455/73 |
| 2013/0271342 A1* | 10/2013 | Shen | ..................... | H04B 1/0458 343/861 |
| 2014/0113679 A1* | 4/2014 | Wehrmann | ........... | H04B 1/0458 455/550.1 |
| 2014/0177686 A1* | 6/2014 | Greene | ..................... | H04B 1/18 375/219 |
| 2014/0256325 A1* | 9/2014 | Hoirup | ................. | H04B 1/0458 455/436 |
| 2014/0306784 A1* | 10/2014 | Broyde | ..................... | H04B 1/18 334/78 |
| 2014/0323075 A1* | 10/2014 | Broyde | ................. | H04B 7/0874 455/275 |
| 2014/0364077 A1* | 12/2014 | Maxim | ................. | H03H 7/0115 455/296 |
| 2015/0063486 A1* | 3/2015 | Broyde | .................... | H01Q 3/40 375/267 |
| 2015/0072626 A1* | 3/2015 | Shitara | ..................... | H03H 7/40 455/77 |
| 2015/0078485 A1* | 3/2015 | Broyde | ................. | H04B 1/0458 375/297 |
| 2015/0133064 A1* | 5/2015 | Horne | ...................... | H03H 7/40 455/77 |
| 2016/0043751 A1* | 2/2016 | Broyde | .................... | H01Q 1/52 455/77 |
| 2016/0269055 A1* | 9/2016 | Greene | ..................... | H04B 1/18 |

FOREIGN PATENT DOCUMENTS

| | | |
|---|---|---|
| FR | 3004604 A1 | 10/2014 |
| WO | WO 2008/010035 A1 | 1/2008 |
| WO | WO 2012/158693 A1 | 11/2012 |
| WO | WO 2014/049475 A2 | 4/2014 |
| WO | WO 2014/049486 A1 | 4/2014 |
| WO | WO 2014/170766 A1 | 10/2014 |

OTHER PUBLICATIONS

Gu et al, "An Analytical Algorithm for Pi-Network Impedance Tuners", IEEE Transactions on Circuits and Systems—I: Regular Papers, vol. 58, No. 12, pp. 2894-2905, Dec. 2011.
Boyle et al, "A Self-Contained Adaptive Antenna Tuner for Mobile Phones", Proceedings of the 6th European Conference on Antenna and Propagation (EUCAP), pp. 1804-1808, Mar. 2012.
Broyde et al, "Some Properties of Multiple-Antenna-Port and Multiple-User-Port Antenna Tuners", IEEE Trans. on Circuits and Systems—I: Regular Papers, vol. 62, No. 2, pp. 423-432, Feb. 2015.
Broyde et al, "A New Multiple-Antenna-Port and Multiple-User-Port Antenna Tuner", proceedings of the 2015 IEEE Radio & Wireless Week, RWW 2015, Jan. 2015.
Search report and written opinion for International Application No. PCT/IB2015/051548.
Krewski et al, "Matching Network Synthesis for Mobile MIMO Antennas Based on Minimization of the Total Multi-Port Reflectance", Proc. of the 2011 Loughborough Antenna and Propagation Conference, LAPC 2011, pp. 1-4, Nov. 14-15, 2011.
Preston Geren et al, "A Practical Technique for Designing Multiport Coupling Networks", IEEE Trans. on Microwave Theory and Techniques, vol. 44, No. 3, pp. 364-371, Mar. 1996.

* cited by examiner

RADIO COMMUNICATION USING MULTIPLE ANTENNAS AND LOCALIZATION VARIABLES

CROSS REFERENCE TO RELATED APPLICATIONS

This is a Continuation application of PCT application No. PCT/IB2015/051548, filed 3 Mar. 2015, published in English under No. WO 2015/136409, which in turn claims priority to French patent application No. 1400606 of 13 Mar. 2014, entitled "Communication radio utilisant des antennes multiples et des variables de localisation", both of which are incorporated herein by reference.

FIELD OF THE INVENTION

The invention relates to a method for radio communication using multiple antennas and localization variables. The invention also relates to an apparatus for radio communication using multiple antennas and localization variables. The received or emitted radio signals may carry information of any nature, for instance signals for speech transmission and/or image transmission (television) and/or data transmission. The received or emitted radio signals may be used for any type of operation, for instance broadcasting, bidirectional point-to-point radio communication or radio communication in a cellular network.

PRIOR ART

The impedance presented by an antenna depends on the frequency and on the electromagnetic characteristics of the volume surrounding the antenna. In particular, if the antenna is built in a portable transceiver, for instance a mobile phone, the body of the user has an effect on the impedance presented by the antenna, and this impedance depends on the position of the body of the user. This is referred to as "user interaction", or "hand effect" or "finger effect".

An antenna tuning apparatus, also referred to as antenna tuner, is a passive apparatus intended to be inserted between a radio device, for instance a radio transmitter or a radio receiver, and its antenna to obtain that the impedance seen by the radio device is close to a wanted value. FIG. 1 shows a block diagram of a typical use of such an antenna tuning apparatus (31) for tuning a single antenna (11), the antenna operating (or being used) in a given frequency band. The antenna tuning apparatus (31) comprises:
- an antenna port (311), the antenna port being coupled to the antenna (11) through a feeder (21), the antenna port (311) seeing, at a frequency in said given frequency band, an impedance referred to as the impedance seen by the antenna port;
- a radio port (312), the radio port being coupled to the radio device (5) through an interconnection (41), the radio port (312) presenting, at said frequency in said given frequency band, an impedance referred to as the impedance presented by the radio port;
- one or more adjustable impedance devices, each of the adjustable impedance devices having a reactance at said frequency in said given frequency band, the reactance of any one of the adjustable impedance devices being adjustable and having an influence on the impedance presented by the radio port.

The radio device (5) is an active equipment for radio communication such as a transmitter, a receiver or a transceiver. The feeder (21) may for instance be a coaxial cable.

In some cases, when the antenna tuning apparatus (31) is placed close to the antenna (11), the feeder (21) is not present. The interconnection (41) may for instance be a coaxial cable. In some cases, when the antenna tuning apparatus (31) is placed close to the radio device (5), the interconnection (41) is not present.

An antenna tuning apparatus behaves, at any frequency in the given frequency band, with respect to the antenna port and the radio port, substantially as a passive linear 2-port device. Here, "passive" is used in the meaning of circuit theory, so that the antenna tuning apparatus does not provide amplification. In practice, losses are undesirable for signals applied to the antenna port or the radio port of an antenna tuning apparatus, in the given frequency band. Thus, an ideal antenna tuning apparatus is lossless for signals applied to its antenna port or radio port, in the given frequency band.

FIG. 2 shows a schematic diagram of an antenna tuning apparatus (31) which could be used as shown in FIG. 1 to tune a single antenna, the antenna being used in a given frequency band. The antenna tuning apparatus shown in FIG. 2 comprises:
- an antenna port (311) having two terminals (3111) (3112), the antenna port being single-ended;
- a radio port (312) having two terminals (3121) (3122), the radio port being single-ended;
- an adjustable impedance device (313) presenting a negative reactance and being coupled in parallel with the antenna port;
- a coil (315);
- an adjustable impedance device (314) presenting a negative reactance and being coupled in parallel with the radio port.

An antenna tuning apparatus of the type shown in FIG. 2 is for instance used in the article of F. Chan Wai Po, E. de Foucault, D. Morche, P. Vincent and E. Kerhervé entitled "A Novel Method for Synthesizing an Automatic Matching Network and Its Control Unit", published in *IEEE Transactions on Circuits and Systems—I: Regular Papers*, vol. 58, No. 9, pp. 2225-2236 in September 2011. The article of Q. Gu, J. R. De Luis, A. S. Morris, and J. Hilbert entitled "An Analytical Algorithm for Pi-Network Impedance Tuners", published in *IEEE Transactions on Circuits and Systems—I: Regular Papers*, vol. 58, No. 12, pp. 2894-2905 in December 2011, and the article of K. R. Boyle, E. Spits, M. A. de Jongh, S. Sato, T. Bakker and A. van Bezooijen entitled "A Self-Contained Adaptive Antenna Tuner for Mobile Phones", published in *Proceedings of the 6th European Conference on Antenna and Propagation (EUCAP)*, pp. 1804-1808 in March 2012, consider an antenna tuning apparatus of a type similar to the one shown in FIG. 2, the main difference being that the coil (315) of FIG. 2 is replaced with an adjustable impedance device, the adjustable impedance device being a variable inductor or an inductor connected in parallel with a variable capacitor.

An antenna tuning apparatus may be used to compensate a variation in the impedance seen by the antenna port, caused by a variation in the frequency of operation, and/or to compensate the user interaction.

The impedance matrix presented by a multiport antenna array depends on the frequency and on the electromagnetic characteristics of the volume surrounding the antennas. In particular, if the multiport antenna array is built in a portable transceiver using multiple antennas simultaneously for MIMO communication, for instance a user equipment (UE) of an LTE wireless network, the impedance matrix presented by the multiport antenna array is affected by the user interaction.

Another antenna tuning apparatus, which may be referred to as "multiple-antenna-port and multiple-radio-port antenna tuning apparatus", is a passive apparatus intended to be inserted between a radio device using multiple antennas simultaneously in a frequency band, for instance a radio transmitter or a radio receiver for MIMO communication, and said multiple antennas, to obtain that the impedance matrix seen by the radio device is close to a wanted value. FIG. 3 shows a block diagram of a typical use of such an antenna tuning apparatus (3) for simultaneously tuning 4 antennas (11) (12) (13) (14), the 4 antennas operating in a given frequency band, the 4 antennas forming an antenna array (1). In FIG. 3, the antenna tuning apparatus (3) comprises:

- n=4 antenna ports (311) (321) (331) (341), each of the antenna ports being coupled to one of the antennas (11) (12) (13) (14) through a feeder (21) (22) (23) (24), the antenna ports seeing, at a frequency in said given frequency band, an impedance matrix referred to as the impedance matrix seen by the antenna ports;
- m=4 radio ports (312) (322) (332) (342), each of the radio ports being coupled to the radio device (5) through an interconnection (41) (42) (43) (44), the radio ports presenting, at said frequency in said given frequency band, an impedance matrix referred to as the impedance matrix presented by the radio ports;
- p adjustable impedance devices, where p is an integer typically greater than or equal to m, each of the adjustable impedance devices having a reactance at said frequency in said given frequency band, the reactance of any one of the adjustable impedance devices being adjustable and having an influence on the impedance matrix presented by the radio ports.

A multiple-antenna-port and multiple-radio-port antenna tuning apparatus behaves, at any frequency in the given frequency band, with respect to the n antenna ports and the m radio ports, substantially as a passive linear (n+m)-port device. Here "passive" is again used in the meaning of circuit theory, so that the multiple-antenna-port and multiple-radio-port antenna tuning apparatus does not provide amplification. In practice, losses are undesirable for signals applied to the antenna ports or the radio ports of a multiple-antenna-port and multiple-radio-port antenna tuning apparatus, in the given frequency band. Thus, an ideal multiple-antenna-port and multiple-radio-port antenna tuning apparatus is lossless for signals applied to its antenna ports or radio ports, in the given frequency band.

FIG. 4 shows a schematic diagram of an antenna tuning apparatus (3) which could be used as shown in FIG. 3 to tune 4 antennas, the antennas being used in a given frequency band. The antenna tuning apparatus shown in FIG. 4 comprises:

- n=4 antenna ports (311) (321) (331) (341), each of the antenna ports being single-ended;
- m=4 radio ports (312) (322) (332) (342), each of the radio ports being single-ended;
- n adjustable impedance devices (301) each presenting a negative reactance and each being coupled in parallel with one of the antenna ports;
- n (n−1)/2 adjustable impedance devices (302) each presenting a negative reactance and each having a first terminal coupled to one of the antenna ports and a second terminal coupled to one of the antenna ports which is different from the antenna port to which the first terminal is coupled;
- n=m windings (303) each having a first terminal coupled to one of the antenna ports and a second terminal coupled to one of the radio ports;
- m adjustable impedance devices (304) each presenting a negative reactance and each being coupled in parallel with one of the radio ports;
- m (m−1)/2 adjustable impedance devices (305) each presenting a negative reactance and each having a first terminal coupled to one of the radio ports and a second terminal coupled to one of the radio ports which is different from the radio port to which the first terminal is coupled.

A multiple-antenna-port and multiple-radio-port antenna tuning apparatus of the type shown in FIG. 4 is disclosed in the French patent application number 12/02542 entitled "Appareil d'accord d'antenne pour un réseau d'antennes à accès multiples" and in the corresponding international application PCT/IB2013/058423 (WO 2014/049475) entitled "Antenna tuning apparatus for a multiport antenna array".

A multiple-antenna-port and multiple-radio-port antenna tuning apparatus may be used to compensate a variation in the impedance matrix seen by the antenna ports, caused by a variation in the frequency of operation, and/or to compensate the user interaction.

An antenna tuning apparatus may be such that the reactance value of any one of its adjustable impedance devices is adjusted manually. This type of manual tuning requires a skilled operator, and is for instance implemented to adjust some antenna tuning apparatuses for radio amateurs, having a single antenna port and a single radio port as shown in FIG. 1 and FIG. 2.

An antenna tuning apparatus may be such that the reactance of each of its adjustable impedance devices is adjustable by electrical means. Such an antenna tuning apparatus may be such that the reactance value of any one of its adjustable impedance devices is adjusted automatically or adaptively. In this case, if the antenna tuning apparatus and the circuits providing an automatic or adaptive adjustment of its adjustable impedance devices form a single device, this device may be referred to as "automatic antenna tuning apparatus", or "automatic antenna tuner" or "adaptive antenna tuner".

Automatic antenna tuning has been applied for a long time to an antenna tuning apparatus having a single antenna port and a single radio port, as shown in the patent of the U.S. Pat. No. 2,745,067 entitled "Automatic Impedance Matching Apparatus", and in the patent of the U.S. Pat. No. 4,493,112 entitled "Antenna Tuner Discriminator". Automatic antenna tuning applied to an antenna tuner having a single antenna port and a single radio port is also the subject matter of current research work, some of which is for instance described in said technical articles entitled "A Novel Method for Synthesizing an Automatic Matching Network and Its Control Unit", "An Analytical Algorithm for Pi-Network Impedance Tuners", and "A Self-Contained Adaptive Antenna Tuner for Mobile Phones".

Automatic antenna tuning has recently been applied to a multiple-antenna-port and multiple-radio-port antenna tuning apparatus used for radio reception, as shown in the patent of the U.S. Pat. No. 8,059,058 entitled "Antenna system and method for operating an antenna system", and in the French patent application number 12/02564 entitled "Procédé et dispositif pour la réception radio utilisant un appareil d'accord d'antenne et une pluralité d'antennes", corresponding to the international application number PCT/IB2013/058574 (WO 2014/049486) entitled "Method and device for radio reception using an antenna tuning apparatus and a plurality of antennas". In both cases, a typical automatic tuning process involves the assessment of one or more quantities representative of the quality of a MIMO link, for a finite set of tuning instructions, each tuning instruction corresponding to a value of the reactance of each of the adjustable impedance devices. However, if we for instance consider that the reactance of each of the 20 adjustable impedance devices shown in FIG. 4 may take on 8 values, the automatic tuning process may involve the assessment of one or more quantities representative of the quality of the MIMO link, for $8^{20}$ tuning instructions. This automatic tuning process would require so much time that it cannot be implemented in practice.

Automatic antenna tuning has also recently been applied to a multiple-antenna-port and multiple-radio-port antenna tuning apparatus used for radio emission, as shown in the French patent application number 13/00878 entitled "Procédé et appareil pour accorder automatiquement une matrice impédance, et émetteur radio utilisant cet appareil", corresponding to the international application number PCT/IB2014/058933 entitled "Method and apparatus for automatically tuning an impedance matrix, and radio transmitter using this apparatus". In this case, a typical automatic tuning process involves either a computationally intensive derivation of a tuning instruction such that an immittance matrix presented by the radio ports is substantially equal to a wanted immittance matrix, or the assessment of a norm of a matrix, for instance a matrix of voltage reflection coefficients at the radio ports, for a finite set of tuning instructions. This automatic tuning process might require either a large computational resource, or too much time, like the typical automatic tuning process discussed above for radio reception.

SUMMARY OF THE INVENTION

The purposes of the invention are a method for radio communication and an apparatus for radio communication using an antenna tuning apparatus and a plurality of antennas, without the above-mentioned limitations of known techniques.

The method of the invention is a method for radio communication with several antennas in a given frequency band, the method using an apparatus for radio communication that includes n antennas, where n is an integer greater than or equal to 2, the method comprising the steps of:
  estimating a plurality of variables, each of said variables being referred to as "localization variable", each of the localization variables depending on the distance between a part of a human body and a zone of the apparatus for radio communication;
  coupling said n antennas, directly or indirectly, to an antenna tuning apparatus comprising n antenna ports, m radio ports and p adjustable impedance devices, where m is an integer greater than or equal to 2 and where p is an integer greater than or equal to 2m, the p adjustable impedance devices being such that, at a frequency in said given frequency band, each of the adjustable impedance devices has a reactance, the reactance of any one of the adjustable impedance devices being adjustable by electrical means;
  generating a "tuning instruction", each of the localization variables having an influence on the tuning instruction, the tuning instruction having an effect on the reactance of each of the adjustable impedance devices.

Each of said n antennas may be coupled, directly or indirectly, to one and only one of the antenna ports of the antenna tuning apparatus. For instance, an indirect coupling may be a coupling through a feeder and/or through a directional coupler. The antenna tuning apparatus is used to tune said n antennas.

It is possible that at least one of the localization variables is an output of a sensor responsive to a pressure exerted by a part of a human body. Thus, it is possible that at least one of the localization variables is the output of a circuit comprising a switch using a single pressure non-locking mechanical system, the state of which changes while a sufficient pressure is exerted by a part of a human body. It is also possible that at least one of the localization variables is the output of a circuit comprising another type of electromechanical sensor responsive to a pressure exerted by a part of a human body, for instance a microelectromechanical sensor (MEMS sensor).

It is possible that at least one of the localization variables is an output of a proximity sensor, such as a proximity sensor dedicated to the detection of a human body. Such a proximity sensor may for instance be a capacitive proximity sensor, or an infrared proximity sensor using reflected light intensity measurements, or an infrared proximity sensor using time-of-flight measurements, which are well known to specialists.

It is possible that the set of the possible values of at least one of the localization variables is a finite set. It is possible that at least one of the localization variables is a binary variable, that is to say such that the set of the possible values of said at least one of the localization variables has exactly two elements. For instance, a capacitive proximity sensor dedicated to the detection of a human body (for instance the device SX9300 of Semtech) can be used to obtain a binary variable, which indicates whether or not a human body has been detected near a zone of the apparatus for radio communication. It is possible that the set of the possible values of any one of the localization variables is a finite set. However, it is possible that the set of the possible values of at least one of the localization variables is an infinite set, and it is possible that the set of the possible values of at least one of the localization variables is a continuous set.

It is possible that the set of the possible values of at least one of the localization variables has at least three elements. For instance, an infrared proximity sensor using time-of-flight measurements and dedicated to the assessment of the distance to a human body (for instance the device VL6180 of STMicroelectronics) can be used to obtain a localization variable such that the set of the possible values of the localization variable has three or more elements, one of the values meaning that no human body has been detected, each of the other values corresponding to a different distance between a zone of the apparatus for radio communication and the nearest part of a detected human body. It is possible that the set of the possible values of any one of the localization variables has at least three elements.

It is possible that at least one of the localization variables is an output of a sensor which is not dedicated to human detection. For instance, it is possible that at least one of the localization variables is determined by a change of state of a switch of a keypad or keyboard, which is indicative of the position of a human finger. For instance, it is possible that at least one of the localization variables is determined by a change of state of an output of a touchscreen, which is indicative of the position of a human finger. Such a touchscreen may use any one of the available technologies, such as a resistive touchscreen, a capacitive touchscreen or a surface acoustic wave touchscreen, etc.

It is said above that each of the localization variables depends on the distance between a part of a human body and a zone of the apparatus for radio communication. This must be interpreted as meaning: each of the localization variables is such that there exists at least one configuration in which the distance between a part of a human body and a zone of the apparatus for radio communication has an effect on said each of the localization variables. However, it is possible that there exist one or more configurations in which the distance between a part of a human body and a zone of the apparatus for radio communication has no effect on said each of the localization variables. For instance, the distance between a part of a human body and a zone of the apparatus for radio communication has no effect on a switch, in a configuration in which no force is directly or indirectly exerted by the human body on the switch. For instance, the distance between a part of a human body and a zone of the apparatus for radio communication has no effect on a proximity sensor if the human body is out of the sensor's range.

The tuning instruction may comprise any type of electrical signal and/or any combination of such electrical signals. The tuning instruction may be generated automatically within the apparatus for radio communication, each of the localization variables having an influence on the tuning instruction. Thus, the tuning instruction is a function of the localization variables. The tuning instruction may also be a function of other variables or quantities.

An apparatus implementing the method of the invention is an apparatus for radio communication using several antennas in a given frequency band, the apparatus for radio communication including n antennas, where n is an integer greater than or equal to 2, the apparatus for radio communication comprising:
- a localization unit, the localization unit estimating a plurality of variables, each of said variables being referred to as "localization variable", each of the localization variables depending on the distance between a part of a human body and a zone of the apparatus for radio communication;
- a processing unit, the processing unit delivering a "tuning instruction", each of the localization variables having an influence on the tuning instruction;
- an antenna tuning apparatus comprising n antenna ports, m radio ports and p adjustable impedance devices, where m is an integer greater than or equal to 2 and where p is an integer greater than or equal to 2m, the p adjustable impedance devices being such that, at a frequency in said given frequency band, each of the adjustable impedance devices has a reactance, the reactance of any one of the adjustable impedance devices being adjustable by electrical means;
- a tuning control unit, the tuning control unit receiving the tuning instruction, the tuning control unit delivering a plurality of "tuning control signals" to the antenna tuning apparatus, the tuning control signals being determined as a function of the tuning instruction, the reactance of each of the adjustable impedance devices being mainly determined by one or more of the tuning control signals.

The radio ports present, at said frequency in said given frequency band, an impedance matrix referred to as "the impedance matrix presented by the radio ports", and the antenna ports see, at said frequency in said given frequency band, an impedance matrix referred to as "the impedance matrix seen by the antenna ports". It is assumed that said antenna tuning apparatus behaves, at any frequency in the given frequency band, with respect to its antenna ports and its radio ports, substantially as a passive linear device (where "passive" is used in the meaning of circuit theory). More precisely, said antenna tuning apparatus behaves, at any frequency in the given frequency band, with respect to the n antenna ports and the m radio ports, substantially as a passive linear (n+m)-port device. As a consequence of linearity, it is possible to define the impedance matrix presented by the radio ports. As a consequence of passivity, the antenna tuning apparatus does not provide amplification.

An adjustable impedance device is a component comprising two terminals which substantially behave as a passive linear two-terminal circuit element, and which are consequently fully characterized by an impedance which may depend on frequency, this impedance being adjustable. An adjustable impedance device may be adjustable by mechanical means, for instance a variable resistor, a variable capacitor, a network comprising a plurality of capacitors and one or more switches or change-over switches used to cause different capacitors of the network to contribute to the reactance, a variable inductor, a network comprising a plurality of inductors and one or more switches or change-over switches used to cause different inductors of the network to contribute to the reactance, or a network comprising a plurality of open-circuited or short-circuited stubs and one or more switches or change-over switches used to cause different stubs of the network to contribute to the reactance. We note that all examples in this list, except the variable resistor, are intended to provide an adjustable reactance.

An adjustable impedance device having a reactance which is adjustable by electrical means may be such that it only provides, at said frequency in said given frequency band, a finite set of reactance values, this characteristic being for instance obtained if the adjustable impedance device is:
- a network comprising a plurality of capacitors or open-circuited stubs and one or more electrically controlled switches or change-over switches, such as electromechanical relays, or microelectromechanical switches (MEMS switches), or PIN diodes or insulated-gate field-effect transistors (MOSFETs), used to cause different capacitors or open-circuited stubs of the network to contribute to the reactance; or
- a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at said frequency in said given frequency band, a continuous set of reactance values, this characteristic being for instance obtained if the adjustable impedance device is based on the use of a variable capacitance diode; or a MOS varactor; or a microelectromechanical varactor (MEMS varactor); or a ferroelectric varactor.

The antenna tuning apparatus may be such that the reactance of any one of the adjustable impedance devices has, at said frequency in said given frequency band, if the impedance matrix seen by the antenna ports is equal to a given diagonal impedance matrix, an influence on the impedance matrix presented by the radio ports. This must be interpreted as meaning: the antenna tuning apparatus may be such that, at said frequency in said given frequency band, there exists a diagonal impedance matrix referred to as the given diagonal impedance matrix, the given diagonal impedance matrix being such that, if the impedance matrix seen by the antenna ports is equal to the given diagonal impedance matrix, then the reactance of any one of the adjustable impedance devices has an influence on the impedance matrix presented by the radio ports.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment.

Figure 5:
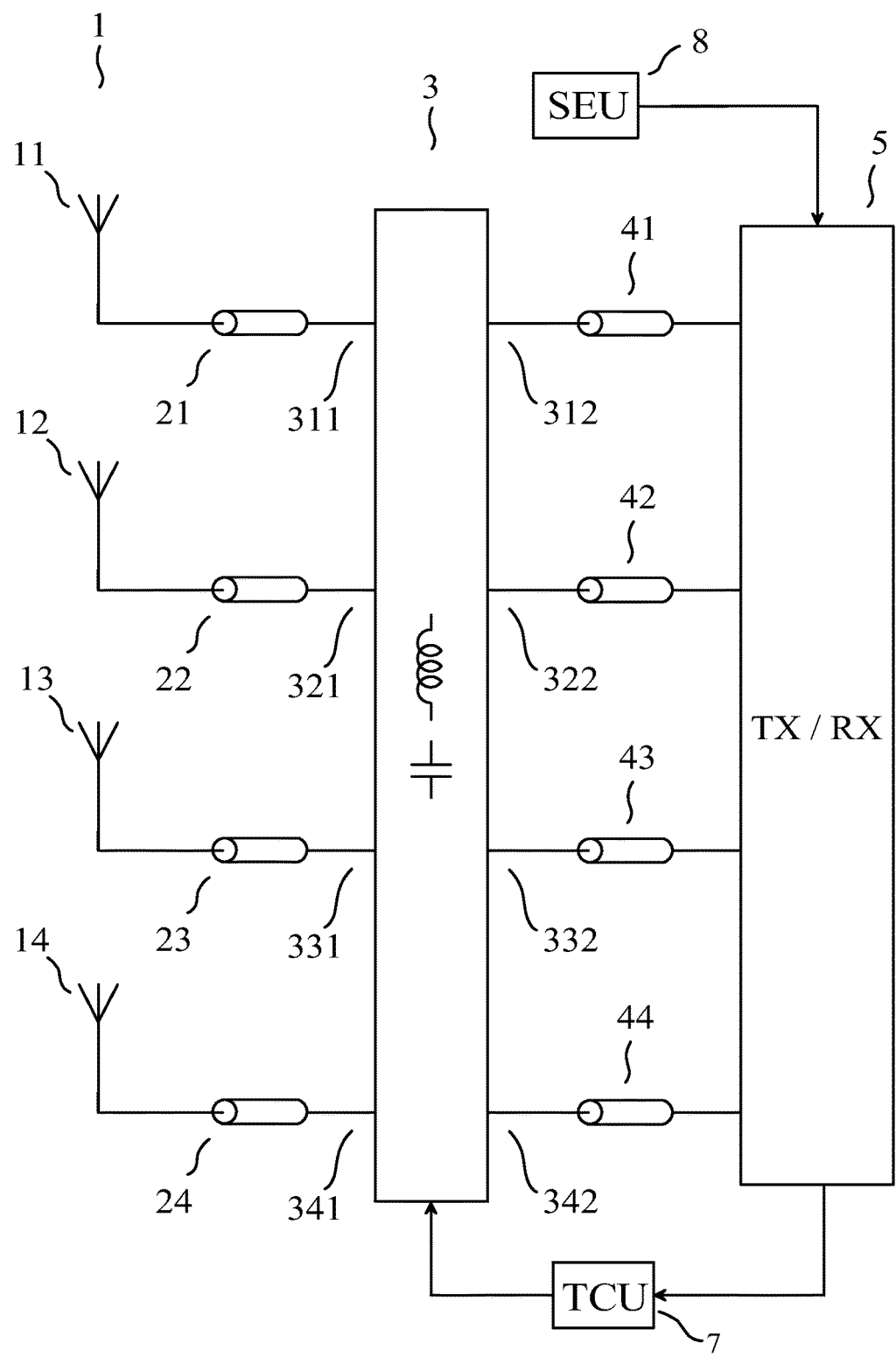
FIG. 5 shows a block diagram of a transceiver for radio communication of the invention, which simultaneously uses 4 antennas.

As a first embodiment of an apparatus of the invention, given by way of non-limiting example, we have represented in FIG. 5 the block diagram of a portable apparatus for radio communication, the apparatus for radio communication being a transceiver comprising:

n=4 antennas (11) (12) (13) (14), the n antennas operating simultaneously in a given frequency band, the n antennas forming an antenna array (1);

a radio device (5) which consists of all parts of the apparatus for radio communication which are not shown elsewhere in FIG. 5;

a sensor unit (8) estimating a plurality of localization variables;

an antenna tuning apparatus (3), the antenna tuning apparatus being a multiple-antenna-port and multiple-radio-port antenna tuning apparatus, the antenna tuning apparatus comprising n=4 antenna ports (311) (321) (331) (341), each of the antenna ports being coupled to one of the antennas through a feeder (21) (22) (23) (24), the antenna tuning apparatus comprising m=4 radio ports (312) (322) (332) (342), each of the radio ports being coupled to the radio device (5) through an interconnection (41) (42) (43) (44), the antenna tuning apparatus comprising p adjustable impedance devices, where p is an integer greater than or equal to 2m, the p adjustable impedance devices being such that, at a frequency in said given frequency band, each of the adjustable impedance devices has a reactance, the reactance of any one of the adjustable impedance devices being adjustable by electrical means;

a tuning control unit (7), the tuning control unit receiving a "tuning instruction" generated automatically within the apparatus for radio communication, the tuning control unit delivering a plurality of "tuning control signals" to the antenna tuning apparatus, the tuning control signals being determined as a function of the tuning instruction, the reactance of each of the adjustable impedance devices being mainly determined by one or more of the tuning control signals.

Figure 6:
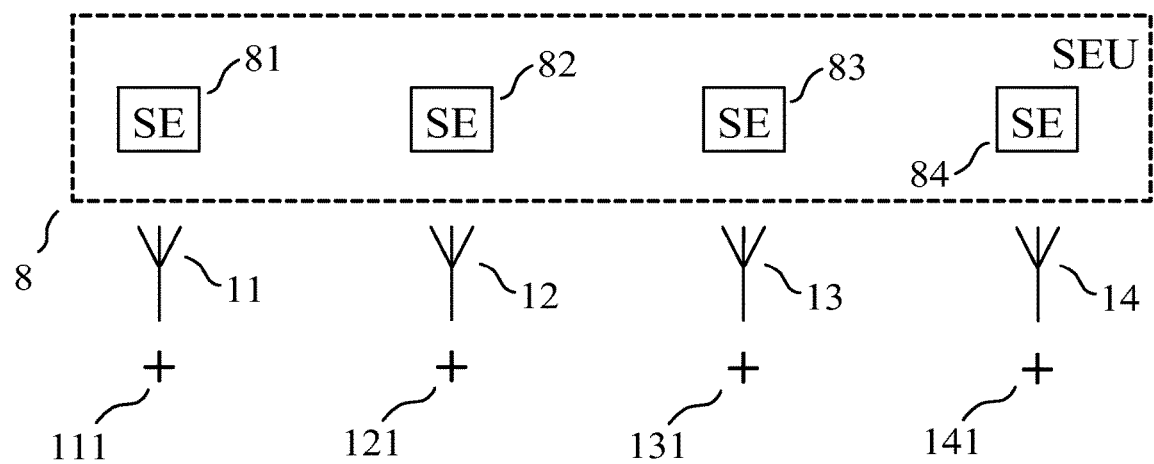
FIG. 6 shows 4 sensors, 4 antennas and the locations of their centers.

The sensor unit (8) estimates a plurality of localization variables each depending, in a given use configuration, on the distance between a part of a human body and a zone of the apparatus for radio communication. As shown in FIG. 6, the sensor unit (8) comprises 4 sensors (81) (82) (83) (84). The first antenna (11) has its center located at a point (111) of the apparatus for radio communication, and one of the sensors (81) estimates a localization variable which depends, in a given use configuration, on the distance between a part of a human body and a zone near this point (111). Likewise, the second antenna (12) has its center located at a point (121) of the apparatus for radio communication, and one of the sensors (82) estimates a localization variable which depends, in a given use configuration, on the distance between a part of a human body and a zone near this point (121). Likewise, the third antenna (13) has its center located at a point (131) of the apparatus for radio communication, and one of the sensors (83) estimates a localization variable which depends, in a given use configuration, on the distance between a part of a human body and a zone near this point (131). Likewise, the fourth antenna (14) has its center located at a point (141) of the apparatus for radio communication, and one of the sensors (84) estimates a localization variable which depends, in a given use configuration, on the distance between a part of a human body and a zone near this point (141). Each of said zones may be a part of the space occupied by the corresponding sensor, this space being inside the space occupied by the apparatus for radio communication, so that in this case each of said zones has a volume much less than the volume of the apparatus for radio communication. For each of the antennas, at least one of the localization variables may depend on the distance between a part of a human body and a small zone near said each of the antennas. If a suitable sensor is used, said zone may be a point, or substantially a point.

The sensor unit (8) assesses (or equivalently, estimates) a plurality of localization variables each depending, in a given use configuration, on the distance between a part of a human body and a zone of the apparatus for radio communication. However, it is possible that one or more other localization variables each depending, in a given use configuration, on the distance between a part of a human body and a zone of the apparatus for radio communication, are not estimated by the sensor unit. Thus, the sensor unit (8) may be regarded as a part of a localization unit which estimates (or evaluates) a plurality of localization variables each depending on the distance between a part of a human body and a zone of the apparatus for radio communication. This part of the localization unit may be the whole localization unit.

The tuning instruction is generated automatically within the radio device (5). More precisely, the radio device (5) comprises a processing unit (not shown in FIG. 5) which delivers the tuning instruction, each of the localization variables having an influence on the tuning instruction. For instance, the tuning instruction may be determined from a set of pre-defined tuning instructions stored in a lookup table (also spelled "look-up table") realized in the processing unit, based on the localization variables and on the frequencies used for radio communication with the antennas (11) (12) (13) (14).

The tuning instruction is generated repeatedly. For instance, the tuning instruction may be generated periodically, for instance every 10 milliseconds.

The apparatus of the invention is a portable apparatus for radio communication, which may be held by a user while it is operating. According to the "Radio Regulations" published by the I.T.U., this type of apparatus for radio communication may be referred to as a mobile apparatus for radio communication. The body of the user has an effect on the impedance matrix presented by the antenna array, and this impedance matrix depends on the position of the body of the user. As said above in the prior art section, this is referred to as "user interaction", or "hand effect" or "finger effect", like the effect of the user's body on the impedance presented by a single antenna. The specialist understands that, since the impedance matrix seen by the antenna port is, in many use configurations, only determined by the frequency of operation and by the user interaction, it is possible to build a lookup table which can be used to determine the tuning instruction based on the localization variables and on the frequencies used for radio communication with the antennas (11) (12) (13) (14). The specialist knows how to build and how to use such a lookup table. The specialist understands that this overcomes the above-mentioned limitations of known techniques, because, in this first embodiment, the tuning instruction is generated quickly and without requiring a large computational resource.

The specialist understands the differences between the apparatus of the invention and a prior art apparatus for radio communication using an antenna and one or more localization variables, disclosed in the patent of the U.S. Pat. No. 8,204,446 entitled "Adaptive Antenna Tuning Systems and Methods". A first major difference is that the invention uses an automatic tuning process for a multiple-antenna-port and multiple-radio-port antenna tuning apparatus, such a process being completely different from an automatic tuning process for the antenna tuning apparatus having a single antenna port and a single radio port considered in said patent of the U.S. Pat. No. 8,204,446. This difference is caused by the interactions between the antennas directly or indirectly coupled to the antenna ports of the multiple-antenna-port and multiple-radio-port antenna tuning apparatus. A second major difference is that the problem to be solved in the case of the apparatus of the invention, namely that the prior art automatic tuning processes for a multiple-antenna-port and multiple-radio-port antenna tuning apparatus typically require either a large computational resource, or too much time, does not exist for the antenna tuning apparatus having a single antenna port and a single radio port considered in said patent of the U.S. Pat. No. 8,204,446. A third major difference is that, in order to solve this problem, a plurality of localization variables is necessary. This is because, to generate a suitable tuning instruction, based on the localization variables and on the frequencies used for radio communication with the antennas, it is necessary that, for each of the antennas, at least one of the localization variables depends on the distance between a part of a human body and a small zone near said each of the antennas.

In this first embodiment, n=m=4. Thus, it is possible that n is greater than or equal to 3, it is possible that n is greater than or equal to 4, it is possible that m is greater than or equal to 3, and it is possible that m is greater than or equal to 4.

Second Embodiment.

The second embodiment of an apparatus of the invention, given by way of non-limiting example, also corresponds to the portable apparatus for radio communication represented in FIG. 5, and all explanations provided for the first embodiment are applicable to this second embodiment.

In this second embodiment, the antenna tuning apparatus (3) is an antenna tuning apparatus disclosed in said French patent application number 12/02542 and said international application PCT/IB2013/058423. Thus, the antenna tuning apparatus (3) is such that the reactance of any one of the adjustable impedance devices has, at said frequency in said given frequency band, if the impedance matrix seen by the antenna ports is equal to a given diagonal impedance matrix, an influence on the impedance matrix presented by the radio ports, and such that the reactance of at least one of the adjustable impedance devices has, at said frequency in said given frequency band, if the impedance matrix seen by the antenna ports is equal to the given diagonal impedance matrix, an influence on at least one non-diagonal entry of the impedance matrix presented by the radio ports. This must be interpreted as meaning: the antenna tuning apparatus is such that, at said frequency in said given frequency band, there exists a diagonal impedance matrix referred to as the given diagonal impedance matrix, the given diagonal impedance matrix being such that, if an impedance matrix seen by the antenna ports is equal to the given diagonal impedance matrix, then (a) the reactance of any one of the adjustable impedance devices has an influence on an impedance matrix presented by the radio ports, and (b) the reactance of at least one of the adjustable impedance devices has an influence on at least one non-diagonal entry of the impedance matrix presented by the radio ports. In the two previous sentences, "an influence" could be replaced with "an effect".

The specialist understands that the antenna tuning apparatus (3) cannot be made up of a plurality of independent and uncoupled antenna tuning apparatuses each having a single antenna port and a single radio port, because in this case, if the impedance matrix seen by the antenna ports is equal to any diagonal impedance matrix, then the impedance matrix presented by the radio ports is a diagonal matrix, the non-diagonal entries of which cannot be influenced by anything.

Moreover, the antenna tuning apparatus (3) is such that, at said frequency in said given frequency band, if the impedance matrix seen by the antenna ports is equal to a given non-diagonal impedance matrix, a mapping associating the impedance matrix presented by the radio ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives. This must be interpreted as meaning: the antenna tuning apparatus is such that, at said frequency in said given frequency band, there exists a non-diagonal impedance matrix referred to as the given non-diagonal impedance matrix, the given non-diagonal impedance matrix being such that, if an impedance matrix seen by the antenna ports is equal to the given non-diagonal impedance matrix, then a mapping associating an impedance matrix presented by the radio ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives.

The specialist knows that the dimension of the span of the p partial derivatives considered as a real vector space has been used and explained: in said French patent application number 12/02542; in said international application PCT/IB2013/058423; and in the sections I, III, VI, VII and VIII of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015, where said dimension of the span of the p partial derivatives is referred to as the local dimension of the user port impedance range, and denoted by $D_{UR}(Z_{Sant})$.

Thus, the specialist understands that any small variation in the impedance matrix of the antenna array, caused by a change in operating frequency or a change in the medium surrounding the antennas, can be at least partially compensated with a new adjustment of the adjustable impedance devices.

More generally, a specialist understands that, to obtain that any diagonal complex matrix of size m×m has the same diagonal entries as at least one element of the span of the p partial derivatives, it is necessary that the dimension of the span of the p partial derivatives considered as a real vector space is greater than or equal to the dimension of the subspace of the diagonal complex matrices of size m×m considered as a real vector space. Since the dimension of the span of the p partial derivatives considered as a real vector space is less than or equal to p, and since the dimension of the subspace of the diagonal complex matrices of size m×m considered as a real vector space is equal to 2m, the necessary condition implies that p is an integer greater than or equal to 2m. This is why the requirement "p is an integer greater than or equal to 2m" is an essential characteristic of the invention.

Third Embodiment.

The third embodiment of an apparatus of the invention, given by way of non-limiting example, also corresponds to the portable apparatus for radio communication represented in FIG. 5, and all explanations provided for the first embodiment and the second embodiment are applicable to this third embodiment. Additionally, the antenna tuning apparatus (3) used in this third embodiment corresponds to the schematic diagram shown in FIG. 4, and all explanations provided in the prior art section about FIG. 4 are applicable to this third embodiment.

It is possible that mutual induction exists between the windings (303). In this case, the inductance matrix of the windings is not a diagonal matrix.

Figure 1:
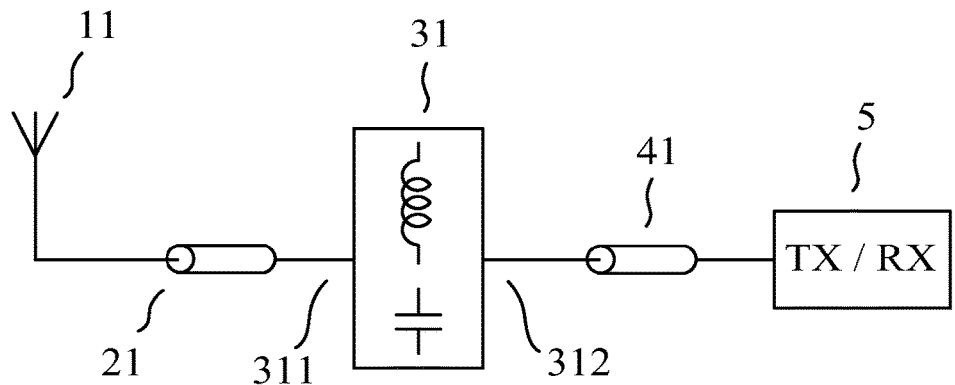
FIG. 1 shows a block diagram of a typical use of an antenna tuning apparatus for tuning a single antenna, and has already been discussed in the section dedicated to the presentation of the prior art.
Figure 2:
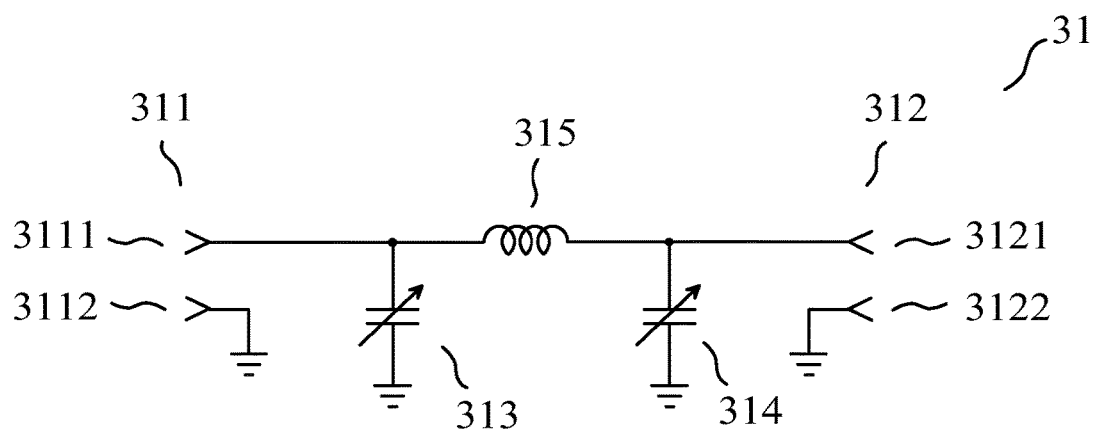
FIG. 2 shows a schematic diagram of an antenna tuning apparatus which could be used as shown in FIG. 1 to tune a single antenna, and has already been discussed in the section dedicated to the presentation of the prior art.
Figure 3:
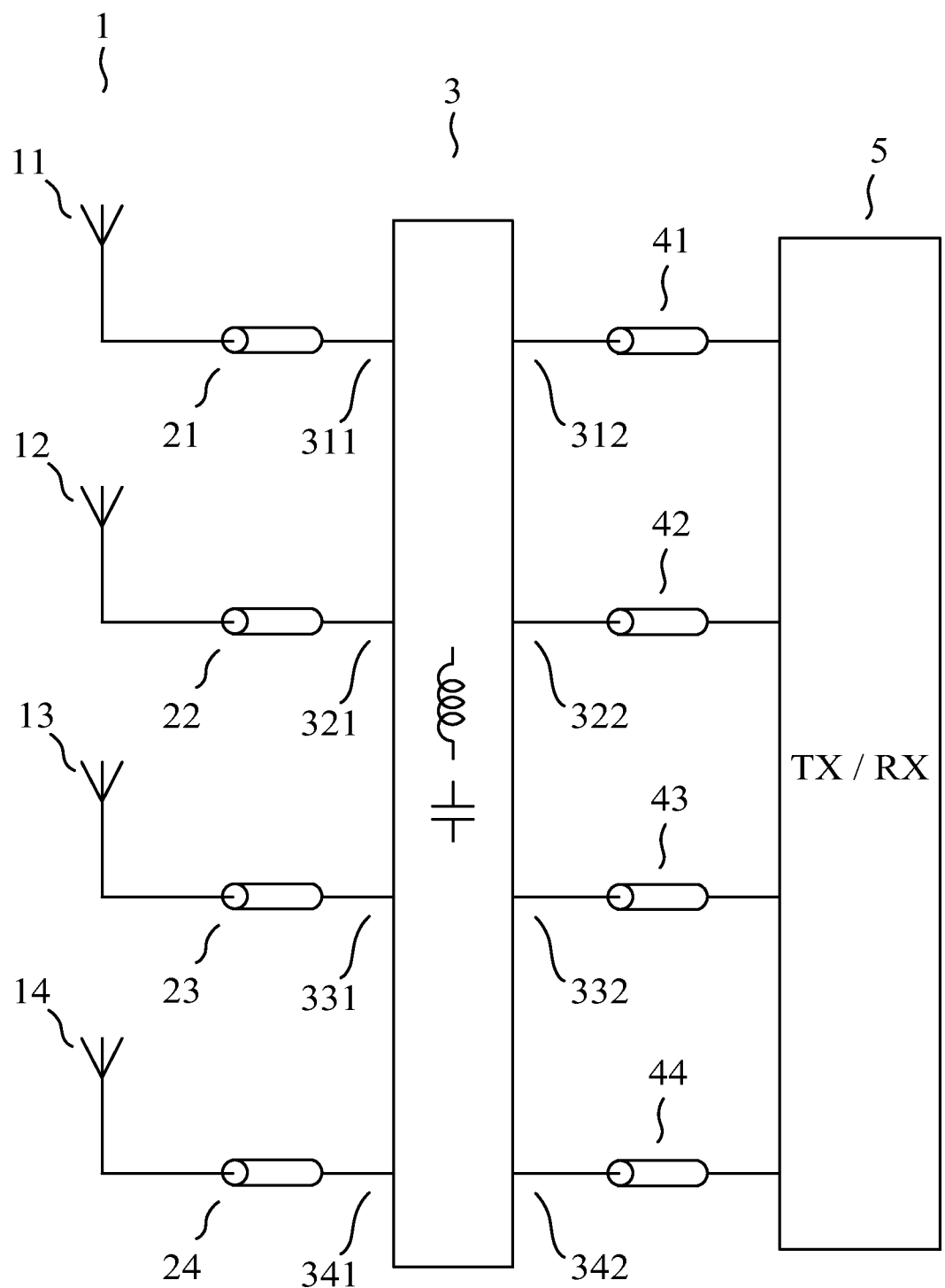
FIG. 3 shows a block diagram of a typical use of an antenna tuning apparatus for simultaneously tuning 4 antennas, and has already been discussed in the section dedicated to the presentation of the prior art.
Figure 4:
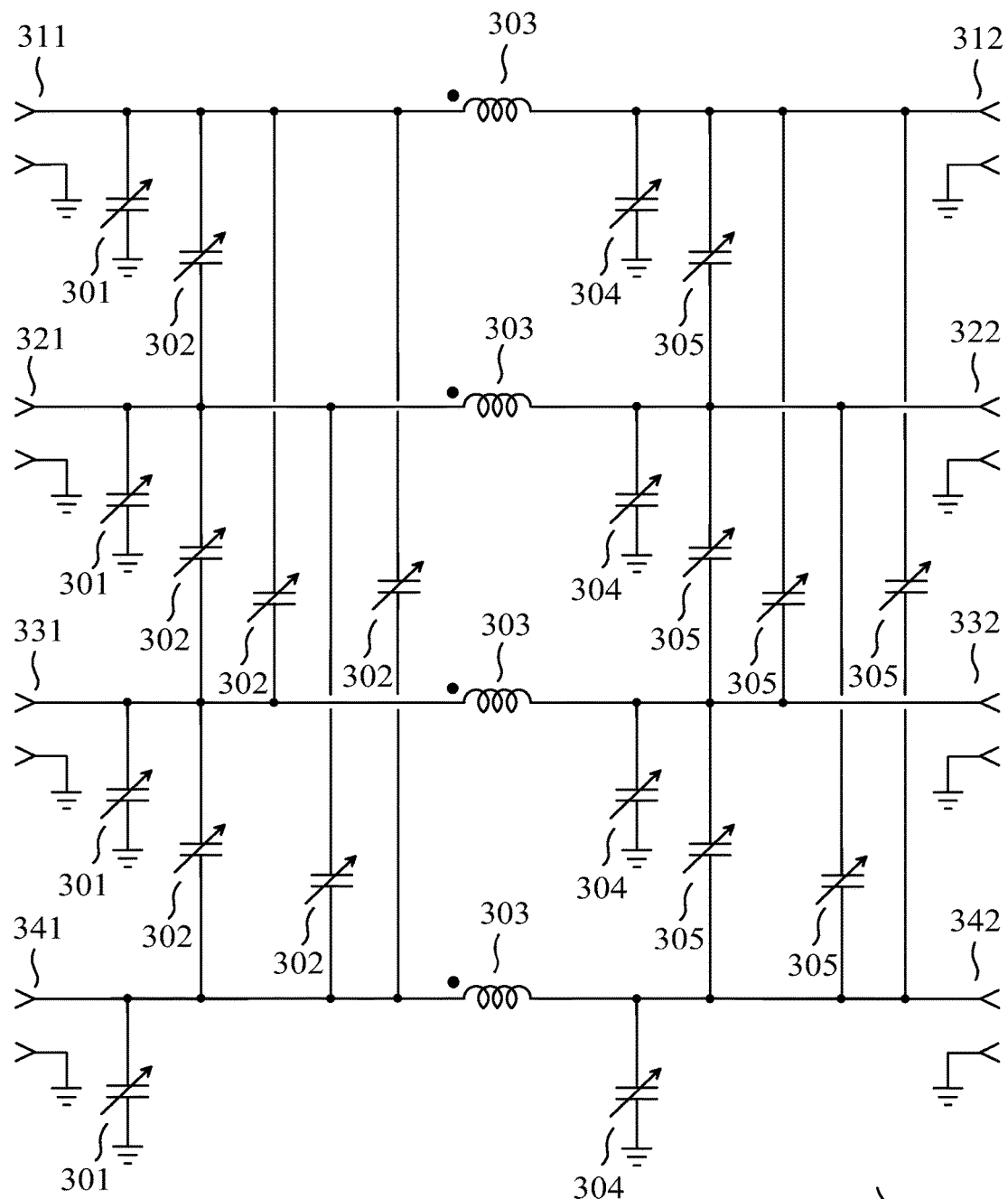
FIG. 4 shows a schematic diagram of an antenna tuning apparatus which could be used as shown in FIG. 3 to simultaneously tune 4 antennas, and has already been discussed in the section dedicated to the presentation of the prior art.

All adjustable impedance devices (301) (302) (304) (305) are adjustable by electrical means, but the circuits and the control links needed to determine the reactance of each of the adjustable impedance devices are not shown in FIG. 4.

In this third embodiment, we have n=m and we use p=m (m+1)=20 adjustable impedance devices.

The specialist understands that, at a frequency at which the antenna tuning apparatus is intended to operate, if the impedance matrix seen by the antenna ports is a diagonal matrix having all its diagonal entries equal to 50Ω, the reactance of any one of the adjustable impedance devices has an influence on the impedance matrix presented by the radio ports, and the reactance of one or more of the adjustable impedance devices has an influence on one or more of the non-diagonal entries of the impedance matrix presented by the radio ports.

The impedance matrix seen by the antenna ports being a given symmetric complex matrix, it is possible to show that, for suitable component values, the p partial derivatives defined above in the section on the second embodiment are linearly independent in the real vector space of the complex matrices of size m×m, this vector space, denoted by E, being of dimension $2m^2$. Thus, the span of the p partial derivatives in E is a subspace of dimension p equal to the set of the symmetric complex matrices of size m×m. Here, any symmetric complex matrix of size m×m is an element of the span of the p partial derivatives. Consequently, any diagonal complex matrix of size m×m has the same diagonal entries as at least one element of the span of the p partial derivatives.

The reactance of an adjustable impedance device may depend on the ambient temperature, for some types of adjustable impedance devices. If such a type of adjustable impedance device is used in the antenna tuning apparatus, it is possible that the tuning control signals are determined as a function of the tuning instruction and as a function of temperature, to compensate the effect of temperature on the reactance of each of the adjustable impedance devices. The tuning control signals are determined as a function of the tuning instruction and as a function of temperature, to compensate the effect of temperature on the reactance of at least one of the adjustable impedance devices of the antenna tuning apparatus.

The specialist understands that, as explained in said article entitled "Some Properties of Multiple-Antenna-Port and Multiple-User-Port Antenna Tuners" and in the article of F. Broydé and E. Clavelier entitled "A New Multiple-Antenna-Port and Multiple-User-Port Antenna Tuner", published in the proceedings of the 2015 *IEEE Radio & Wireless Week, RWW* 2015, in January 2015, any small variation in the impedance matrix of the antenna array, caused by a change in operating frequency or a change in the medium surrounding the antennas, can be compensated with a new adjustment of the adjustable impedance devices. Thus, it is always possible to compensate the user interaction.

If the adjustable impedance devices (302) each having a first terminal coupled to one of the antenna ports and a second terminal coupled to one of the antenna ports which is different from the antenna port to which the first terminal is coupled were not present in FIG. 4, if the adjustable impedance devices (305) each having a first terminal coupled to one of the radio ports and a second terminal coupled to one of the radio ports which is different from the radio port to which the first terminal is coupled were not present in FIG. 4, and if mutual induction did not exist between the windings (303), then the antenna tuning apparatus (3) comprising n=4 antenna ports and m=4 radio ports would in fact be made up of n=4 antenna tuning apparatuses each having a single antenna port and a single radio port, these antenna tuning apparatuses each having a single antenna port and a single radio port being independent and uncoupled. In this case, the method of the invention may become a method for radio communication with several antennas in a given frequency band, using an apparatus for radio communication that includes n antennas, where n is an integer greater than or equal to 2, the method comprising the steps of:
- estimating a plurality of variables, each of said variables being referred to as "localization variable", each of the localization variables depending on the distance between a part of a human body and a zone of the apparatus for radio communication;
- coupling said n antennas, directly or indirectly, to n antenna tuning apparatuses, each of said antenna tuning apparatuses comprising one antenna port, one radio port, and two or more adjustable impedance devices such that, at a frequency in said given frequency band, each of the adjustable impedance devices of said each of said antenna tuning apparatuses has a reactance, the reactance of any one of the adjustable impedance devices being adjustable by electrical means;
- generating a "tuning instruction", each of the localization variables having an influence on the tuning instruction, the tuning instruction having an effect on the reactance of each of the adjustable impedance devices.

In this method, each of the antennas may be coupled, directly or indirectly, to one and only one of the antenna ports of the n antenna tuning apparatuses.

An apparatus implementing this method is an apparatus for radio communication using several antennas in a given frequency band, the apparatus for radio communication including n antennas, where n is an integer greater than or equal to 2, the apparatus for radio communication comprising:
- a localization unit, the localization unit estimating a plurality of variables, each of said variables being referred to as "localization variable", each of the localization variables depending on the distance between a part of a human body and a zone of the apparatus for radio communication;
- a processing unit, the processing unit delivering a "tuning instruction", each of the localization variables having an influence on the tuning instruction;
- n antenna tuning apparatuses, each of said antenna tuning apparatuses comprising one antenna port, one radio port, and two or more adjustable impedance devices such that, at a frequency in said given frequency band, each of the adjustable impedance devices of said each of said antenna tuning apparatuses has a reactance, the reactance of any one of the adjustable impedance devices being adjustable by electrical means;
- a tuning control unit, the tuning control unit receiving the tuning instruction, the tuning control unit delivering a plurality of "tuning control signals" to the antenna tuning apparatus, the tuning control signals being determined as a function of the tuning instruction, the reactance of each of the adjustable impedance devices being mainly determined by one or more of the tuning control signals.

Fourth Embodiment.

The fourth embodiment of a device of the invention, given by way of non-limiting example, also corresponds to the portable apparatus for radio communication represented in FIG. 5, and all explanations provided for the first embodiment are applicable to this fourth embodiment.

In this fourth embodiment, the localization variables each depending on the distance between a part of a human body and a zone of the apparatus for radio communication, and having each an influence on the tuning instruction, are estimated by the sensor unit (8). Consequently, the sensor unit (8) forms a localization unit which estimates a plurality of localization variables each depending on the distance between a part of a human body and a zone of the apparatus for radio communication.

Fifth Embodiment.

The fifth embodiment of a device of the invention, given by way of non-limiting example, also corresponds to the portable apparatus for radio communication represented in FIG. 5, and all explanations provided for the first embodiment are applicable to this fifth embodiment.

Figure 7:
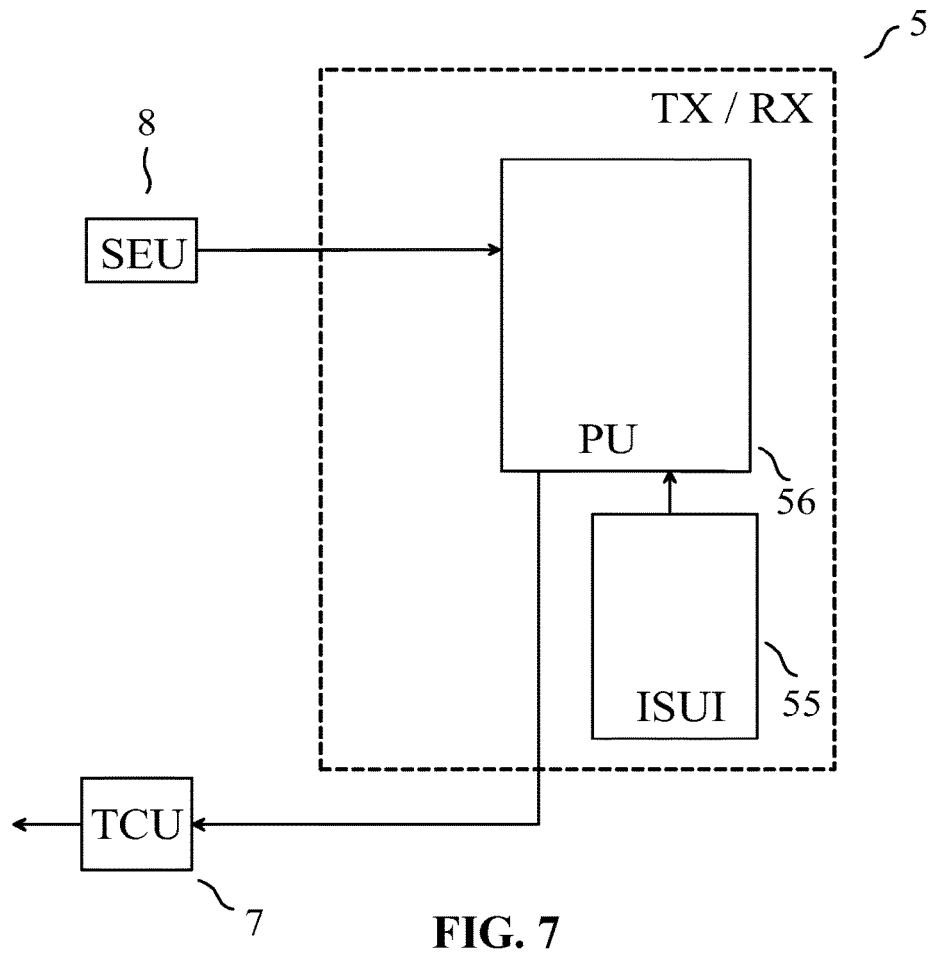
FIG. 7 shows a part of a block diagram of a transceiver for radio communication of the invention.

In this fifth embodiment, as shown in FIG. 7, the radio device (5) comprises a processing unit (56) which delivers the tuning instruction to the tuning control unit (7). The processing unit (56) receives localization variables from the sensor unit (8). The processing unit (56) also receives one or more localization variables from the user interface, more precisely from the input section of the user interface (55). The input section of the user interface (55) is the part of the user interface which allows the user to provide inputs to the apparatus for radio communication. The input section of the user interface uses a touchscreen. Each localization variables assessed by the input section of the user interface is determined by a change of state of an output of the touchscreen, which is indicative of the position of a finger.

In this fifth embodiment, the localization variables each depending on the distance between a part of a human body and a zone of the apparatus for radio communication, and having each an influence on the tuning instruction, are estimated by the sensor unit (8) or by the input section of the user interface (55). Consequently, the sensor unit (8) and the input section of the user interface (55) form a localization unit which estimates a plurality of localization variables each depending on the distance between a part of a human body and a zone of the apparatus for radio communication.

Sixth Embodiment(Best Mode).

The sixth embodiment of a device of the invention, given by way of non-limiting example and best mode of carrying out the invention also corresponds to the portable apparatus for radio communication represented in FIG. 5, and all explanations provided for the first embodiment are applicable to this sixth embodiment.

Figure 8:
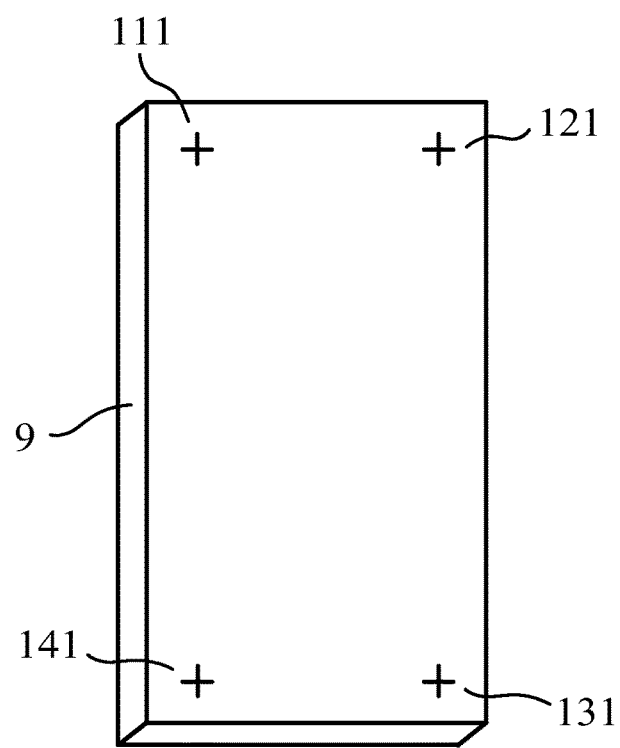
FIG. 8 shows the locations of four antennas of a mobile phone.

In this sixth embodiment, the apparatus for radio communication is a mobile phone. FIG. 8 is a drawing of a back view of the mobile phone (9). FIG. 8 shows the point (111) where the center of the first antenna (11) is located, the point (121) where the center of the second antenna (12) is located, the point (131) where the center of the third antenna (13) is located, and the point (141) where the center of the fourth antenna (14) is located.

Figure 9:
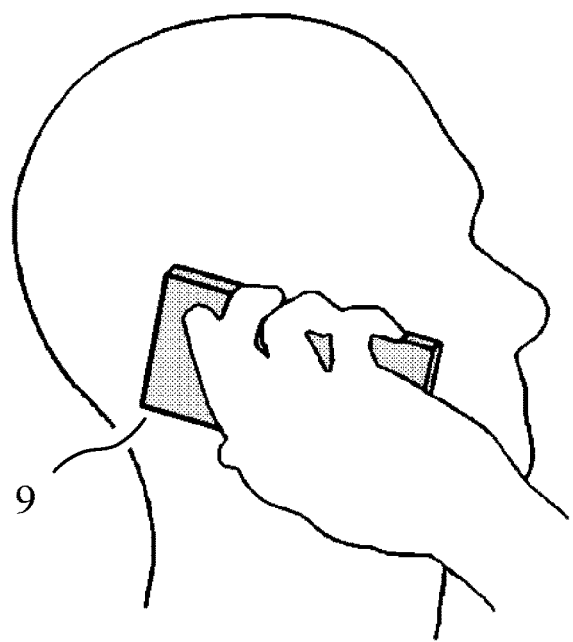
FIG. 9 shows a first typical use configuration (right hand and head configuration)
Figure 10:
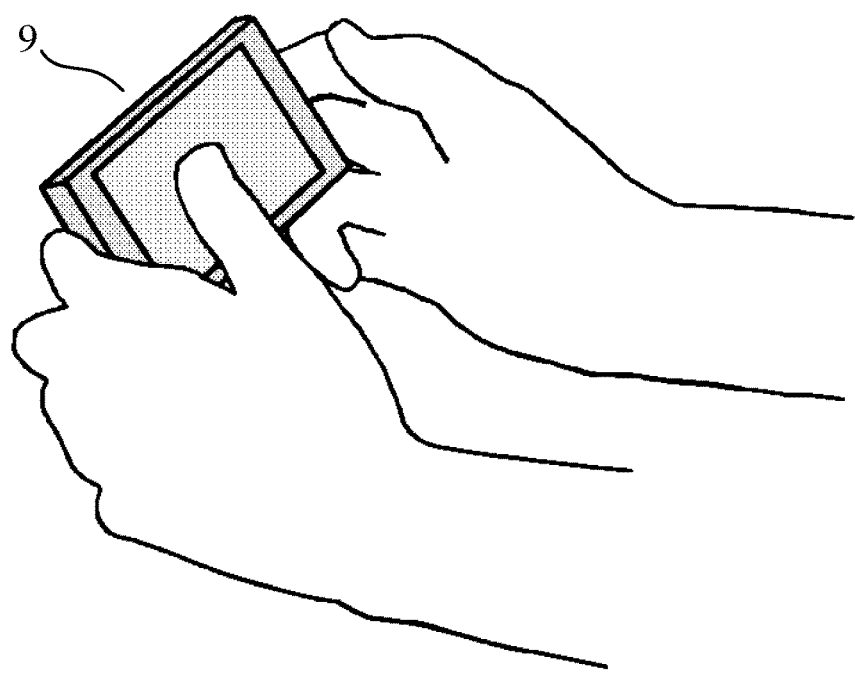
FIG. 10 shows a second typical use configuration (two hands configuration)
Figure 11:
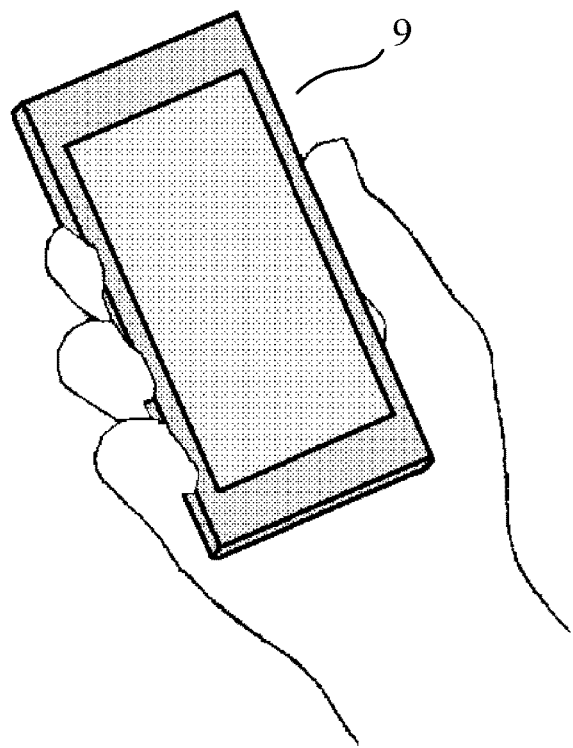
FIG. 11 shows a third typical use configuration (right hand only configuration).

A finite set of typical use configurations is defined. For instance, FIG. 9 shows a first typical use configuration, which may be referred to as the "right hand and head configuration"; FIG. 10 shows a second typical use configuration, which may be referred to as the "two hands configuration"; and FIG. 11 shows a third typical use configuration, which may be referred to as the "right hand only configuration". In FIG. 9, FIG. 10 and FIG. 11, the mobile phone (9) is held by the user. More precisely, the user holds the mobile phone close to his head using his right hand in FIG. 9; the user holds the mobile phone far from his head using both hands in FIG. 10, and the user holds the mobile phone far from his head using his right hand only in FIG. 11. In an actual use configuration, the localization variables assessed by the sensor (81) installed near the point (111) where the center of the first antenna (11) is located, by the sensor (82)

installed near the point (121) where the center of the second antenna (12) is located, by the sensor (83) installed near the point (131) where the center of the third antenna (13) is located, and by the sensor (84) installed near the point (141) where the center of the fourth antenna (14) is located are used to determine the typical use configuration which is the closest to the actual use configuration. The tuning instruction is then determined from a set of pre-defined tuning instructions that are stored in a lookup table realized in the processing unit, based on the closest typical use configuration and on the frequencies used for radio communication with the antennas (11) (12) (13) (14). The specialist understands how to build and use such a lookup table. The specialist understands the advantage of defining and using a set of typical use configurations, which must be sufficiently large to cover all relevant cases, and sufficiently small to avoid an excessively large lookup table.

It has been shown that, for an apparatus for radio communication using a plurality of antennas coupled to a multiple-antenna-port and multiple-radio-port antenna tuning apparatus, more than two typical use configurations must be defined, so that a single localization variable cannot be used to determine a closest typical use configuration. Consequently, in the method of the invention, the requirement according to which "a plurality of localization variables is estimated" is an essential characteristic of the invention. Consequently, in the apparatus of the invention, the requirement according to which "the localization unit estimates a plurality of localization variables" is an essential characteristic of the invention. In particular, according to the invention, the number of localization variables can be greater than or equal to 3, as in the sixth embodiment. In particular, according to the invention, the number of localization variables can be greater than or equal to 4, as in the sixth embodiment.

Additionally, to be able to determine a closest typical use configuration, it is necessary to use localization variables depending on the distance between a part of a human body and different zones of the apparatus for radio communication. More precisely, it is necessary that there exist two of the localization variables, denoted by A and B, the localization variable A depending on the distance between a part of a human body and a zone X of the apparatus for radio communication, the localization variable B depending on the distance between a part of a human body and a zone Y of the apparatus for radio communication, such that X or Y are distinct, or preferably such that X and Y have an empty intersection. As explained above, this result can be obtained using a localization unit comprising a plurality of sensors, such as proximity sensors, located at different places in the apparatus for radio communication, each of said sensors estimating one or more of the localization variables. In particular, according to the invention, the number of sensors each estimating one or more of the localization variables can be greater than or equal to 3, as in the sixth embodiment. In particular, according to the invention, the number of sensors each estimating one or more of the localization variables can be greater than or equal to 4, as in the sixth embodiment.

We can say that, in this embodiment, a first of said localization variables depends on the distance between a part of a human body and a first zone of the apparatus for radio communication, a second of said localization variables depends on the distance between a part of a human body and a second zone of the apparatus for radio communication, the first zone of the apparatus for radio communication and the second zone of the apparatus for radio communication being distinct from one another. Distinct zones may have an empty intersection or a non-empty intersection.

A tuning instruction is generated periodically, at the end of a tuning sequence, and is valid until a next tuning instruction is generated at the end of a next tuning sequence.

In this sixth embodiment, the tuning instruction is a function of the localization variables and of the frequencies used for radio communication with the antennas. The tuning instruction may also be a function of other variables or quantities such as: information on the efficiency of one or more of the antennas, information on isolation between antennas, one or more operational parameters of the apparatus for radio communication, and/or one or more performance metrics of the apparatus for radio communication. The specialist knows how to obtain and use such other variables or quantities. The following seventh, eighth and ninth embodiments are examples in which such other variables or quantities are obtained and used.

Seventh Embodiment.

The seventh embodiment of a device of the invention, given by way of non-limiting example, is an apparatus for radio communication comprising a radio receiver implementing a method for radio reception with several antennas in a given frequency band, the apparatus for radio communication including n antennas, where n is an integer greater than or equal to 2, the method comprising the steps of:

estimating a plurality of variables, each of said variables being referred to as "localization variable", each of the localization variables depending on the distance between a part of a human body and a zone of the apparatus for radio communication;

coupling said n antennas, directly or indirectly, to an antenna tuning apparatus comprising n antenna ports, m radio ports and p adjustable impedance devices, where m is an integer greater than or equal to 2 and where p is an integer greater than or equal to 2m, the p adjustable impedance devices being such that, at a frequency in said given frequency band, each of the adjustable impedance devices has a reactance, the reactance of any one of the adjustable impedance devices being adjustable by electrical means;

processing a plurality of digital signals to estimate one or more quantities representative of a channel matrix;

delivering a "tuning instruction", the tuning instruction being a function of the localization variables and of said one or more quantities representative of a channel matrix, each of the localization variables having an influence on the tuning instruction, the tuning instruction having an effect on the reactance of each of the adjustable impedance devices.

For instance, as in said French patent application number 12/02564 and said international application number PCT/IB2013/058574, the method may be such that, each of the radio ports delivering a signal, each of the digital signals is mainly determined by one and only one of the signals delivered by the radio ports, and such that the channel matrix is a channel matrix between a plurality of signals sent by a transmitter and the m signals delivered by the radio ports. For instance, one or more quantities representative of a channel capacity may be computed as a function of said quantities representative of a channel matrix, and the tuning instruction may be delivered as a function of the localization variables and of said one or more quantities representative of a channel capacity, each of the localization variables having an influence on the tuning instruction. The method may also be such that an adaptive process is implemented during one or more training sequences. A training sequence may comprise the emission of a plurality of quasi-orthogonal or orthogonal signals. The tuning instruction selected during the latest completed training sequence is used for radio reception.

The specialist understands that the antenna tuning obtained in this seventh embodiment may be more accurate than an antenna tuning wherein the tuning instruction is only a function of the localization variables. The specialist also understands that the antenna tuning obtained in this seventh embodiment may be simultaneously accurate and such that the tuning instruction is generated quickly and without requiring a large computational resource.

Eighth Embodiment.

The eighth embodiment of a device of the invention, given by way of non-limiting example, is an apparatus for radio communication comprising a radio transmitter implementing a method for radio emission with several antennas in a given frequency band, the apparatus for radio communication including n antennas, where n is an integer greater than or equal to 2, the method comprising the steps of:
  estimating a plurality of variables, each of said variables being referred to as "localization variable", each of the localization variables depending on the distance between a part of a human body and a zone of the apparatus for radio communication;
  coupling said n antennas, directly or indirectly, to an antenna tuning apparatus comprising n antenna ports, m radio ports and p adjustable impedance devices, where m is an integer greater than or equal to 2 and where p is an integer greater than or equal to 2m, the p adjustable impedance devices being such that, at a frequency in said given frequency band, each of the adjustable impedance devices has a reactance, the reactance of any one of the adjustable impedance devices being adjustable by electrical means;
  estimating q real quantities depending on an impedance matrix presented by the radio ports, where q is an integer greater than or equal to m, using m or more different excitations applied successively to the radio ports;
  delivering a "tuning instruction", the tuning instruction being a function of the localization variables and of said q real quantities depending on an impedance matrix presented by the radio ports, each of the localization variables having an influence on the tuning instruction, the tuning instruction having an effect on the reactance of each of the adjustable impedance devices.

The specialist understands that this eighth embodiment uses some aspects of the technique disclosed in said French patent application number 13/00878 and said international application number PCT/IB2014/058933.

The specialist understands that the antenna tuning obtained in this eighth embodiment may be more accurate than an antenna tuning wherein the tuning instruction is only a function of the localization variables. The specialist also understands that the antenna tuning obtained in this eighth embodiment may be simultaneously accurate and such that the tuning instruction is generated quickly and without requiring a large computational resource.

Ninth Embodiment.

The ninth embodiment of a device of the invention, given by way of non-limiting example, also corresponds to the portable apparatus for radio communication represented in FIG. 5, and all explanations provided for the first embodiment are applicable to this ninth embodiment.

In this ninth embodiment, the tuning instruction is determined as a function of:
  the localization variables, each of the localization variables having an influence on the tuning instruction;
  the frequencies used for radio communication with the antennas;
  one or more additional variables, each of the additional variables lying in a set of additional variables, the elements of the set of additional variables comprising: communication type variables which indicate whether a radio communication session is a voice communication session, a data communication session or another type of communication session; a speakerphone mode activation indicator; a speaker activation indicator; variables obtained using one or more accelerometers; user identity variables which depend on the identity of the current user; reception quality variables which for instance include the quantities representative of a channel matrix of the seventh embodiment; and antenna variables which for instance include the real quantities depending on an impedance matrix presented by the radio ports of the eighth embodiment.

The elements of said set of additional variables may further comprise one or more variables which are different from the localization variables and which characterize the grip with which a user is holding the apparatus for radio communication.

In this ninth embodiment, the tuning instruction may for instance be determined using a lookup table realized in the processing unit.

Based on the teachings of said patent of the U.S. Pat. No. 8,204,446, the specialist understands that the antenna tuning obtained in this ninth embodiment may be more accurate than an antenna tuning wherein the tuning instruction is only a function of the localization variables. The specialist also understands that the antenna tuning obtained in this ninth embodiment may be simultaneously accurate and such that the tuning instruction is generated quickly and without requiring a large computational resource.

INDICATIONS ON INDUSTRIAL APPLICATIONS

The invention is suitable for radio communication using multiple antennas. Thus, the invention is suitable for MIMO radio communication. The apparatus for radio communication may be an apparatus for MIMO radio communication, that is to say an apparatus for MIMO radio reception and/or an apparatus for MIMO radio emission.

The invention provides the best possible characteristics using very close antennas, hence presenting a strong interaction between the antennas. The invention is therefore particularly suitable for mobile apparatuses for radio communication, for instance mobile phones, tablet computers and portable computers.

The invention claimed is:

1. A method for radio communication with several antennas in a given frequency band, the method using an apparatus for radio communication comprising n antennas, where n is an integer greater than or equal to 2, the method comprising the steps of:
  estimating a plurality of localization variables, each of the plurality of localization variables being determined based on a distance between a part of a human body and a zone of the apparatus for radio communication, a first localization variable of the plurality of localization variables being based on a distance between a first part of the human body and a first zone of the apparatus for radio communication, a second localization variable of the plurality of localization variables being based on a distance between a second part of the human body and a second zone of the apparatus for radio communication, the first zone of the apparatus for radio communication and the second zone of the apparatus for radio communication being distinct from one another;

coupling said n antennas, directly or indirectly, to an antenna tuner comprising:
n antenna ports,
m radio ports, and
p adjustable impedance devices, m being an integer greater than or equal to 2 and p being an integer greater than or equal to 2 m, the p adjustable impedance devices being such that, at a frequency in said given frequency band, each of the adjustable impedance devices has a reactance, the reactance of any one of the adjustable impedance devices being adjustable by electrical means; and generating a tuning instruction, the generated tuning instruction being based on each of the plurality of localization variables, wherein the reactance of each of the adjustable impedance devices is adjusted by the tuning instruction based on the plurality of localization variables.

2. The method for radio communication of claim 1, wherein at least one of the plurality of localization variables is an output of a sensor responsive to a pressure exerted by the part of the human body.

3. The method for radio communication of claim 1, wherein at least one of the plurality of localization variables is an output of a proximity sensor.

4. The method for radio communication of claim 1, wherein at least one of the plurality of localization variables is determined based on a change of state of an output of a touchscreen.

5. The method for radio communication of claim 1, wherein the antenna tuner is configured such that, at the frequency in said given frequency band, there exists a diagonal impedance matrix referred to as the given diagonal impedance matrix, the given diagonal impedance matrix being such that, if an impedance matrix seen by the antenna ports is equal to the given diagonal impedance matrix, then the reactance of any one of the adjustable impedance devices has an influence on an impedance matrix presented by the radio ports.

6. The method for radio communication of claim 5, wherein the antenna tuner is configured such that, at the frequency in said given frequency band, if the impedance matrix seen by the antenna ports is equal to the given diagonal impedance matrix, then the reactance of at least one of the adjustable impedance devices has an influence on at least one non-diagonal entry of the impedance matrix presented by the radio ports.

7. The method for radio communication of claim 1, wherein the antenna tuner comprises n antenna tuning apparatuses, each tuning of the n antenna tuning apparatuses comprising:
one of the antenna ports,
one of the radio ports, and
two or more of the adjustable impedance devices.

8. The method for radio communication of claim 1, wherein the apparatus for radio communication further comprises a radio receiver, and wherein the tuning instruction is a function of the localization variables and of one or more quantities representative of a channel matrix.

9. The method for radio communication of claim 1, wherein the apparatus for radio communication further comprises a radio transmitter, and
wherein the tuning instruction is a function of the localization variables and of q real quantities depending on an impedance matrix presented by the radio ports, where q is an integer greater than or equal to m.

10. An apparatus for radio communication using several antennas in a given frequency band, the apparatus for radio communication including n antennas, where n is an integer greater than or equal to 2, the apparatus for radio communication comprising:
a localizer configured to estimate a plurality of localization variables, each of the plurality of localization variables being determined based on a distance between a part of a human body and a zone of the apparatus for radio communication, a first localization variable of the plurality of localization variables being based on a distance between a first part of the human body and a first zone of the apparatus for radio communication, a second localization variable of the plurality of localization variables being based on a distance between a second part of the human body and a second zone of the apparatus for radio communication, the first zone of the apparatus for radio communication and the second zone of the apparatus for radio communication being distinct from one another;
at least one processor configured to deliver a tuning instruction based on each of the plurality of localization variables;
an antenna tuner comprising:
n antenna ports,
m radio ports, and
p adjustable impedance devices, m being an integer greater than or equal to 2 and p being an integer greater than or equal to 2 m, the p adjustable impedance devices being such that, at a frequency in said given frequency band, each of the adjustable impedance devices has a reactance, the reactance of any one of the adjustable impedance devices being adjustable by electrical means; and
at least one tuning processor, the at least one tuning processor configured to:
receive the tuning instruction, and
deliver a plurality of tuning control signals to the antenna tuner, the tuning control signals being determined as a function of the tuning instruction,
wherein the reactance of each of the adjustable impedance devices is adjusted by one or more of the tuning control signals based on the plurality of localization variables.

11. The apparatus for radio communication of claim 10, wherein at least one of the plurality of localization variables is an output of a sensor responsive to a pressure exerted by the part of the human body.

12. The apparatus for radio communication of claim 10, wherein at least one of the plurality of localization variables is an output of a proximity sensor.

13. The apparatus for radio communication of claim 10, wherein at least one of the plurality of localization variables is determined based on a change of state of an output of a touchscreen.

14. The apparatus for radio communication of claim 10, wherein the antenna tuner is configured such that, at the frequency in said given frequency band, there exists a diagonal impedance matrix referred to as the given diagonal impedance matrix, the given diagonal impedance matrix being such that, if an impedance matrix seen by the antenna ports is equal to the given diagonal impedance matrix, then the reactance of any one of the adjustable impedance devices has an influence on an impedance matrix presented by the radio ports.

15. The apparatus for radio communication of claim 14, wherein the antenna tuner is configured such that, at the frequency in said given frequency band, if the impedance matrix seen by the antenna ports is equal to the given diagonal impedance matrix, then the reactance of at least one of the adjustable impedance devices has an influence on at least one non-diagonal entry of the impedance matrix presented by the radio ports.

16. The apparatus for radio communication of claim 10, wherein the antenna tuner is made up of n antenna tuning apparatuses each comprising one of the antenna ports, one of the radio ports, and two or more of the adjustable impedance devices.

17. The apparatus for radio communication of claim 10, wherein the apparatus for radio communication further comprises a radio receiver, and
wherein the tuning instruction is a function of the plurality of localization variables and of one or more quantities representative of a channel matrix.

18. The apparatus for radio communication of claim 10, wherein the apparatus for radio communication further comprises a radio transmitter, and
wherein the tuning instruction is a function of the plurality of localization variables and of q real quantities depending on an impedance matrix presented by the radio ports, where q is an integer greater than or equal to m.

* * * * *